(12) United States Patent
Aliane et al.

(10) Patent No.: US 10,305,023 B2
(45) Date of Patent: May 28, 2019

(54) METHOD FOR MANUFACTURING AN ELECTROACTIVE ACTUATOR

(71) Applicant: COMMISSARIAT A L'ENERGIE ATOMIQUE ET AUX ENERGIES ALTERNATIVES, Paris (FR)

(72) Inventors: Abdelkader Aliane, Grenoble (FR); Mohammed Benwadih, Champigny sur Marne (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 181 days.

(21) Appl. No.: 15/300,561

(22) PCT Filed: Mar. 31, 2015

(86) PCT No.: PCT/EP2015/057117
§ 371 (c)(1),
(2) Date: Sep. 29, 2016

(87) PCT Pub. No.: WO2015/150425
PCT Pub. Date: Oct. 8, 2015

(65) Prior Publication Data
US 2017/0186941 A1 Jun. 29, 2017

(30) Foreign Application Priority Data
Mar. 31, 2014 (FR) .................. 14 52837

(51) Int. Cl.
*H04R 31/00* (2006.01)
*H01L 41/27* (2013.01)
(Continued)

(52) U.S. Cl.
CPC .......... *H01L 41/27* (2013.01); *H01L 41/0471* (2013.01); *H01L 41/083* (2013.01);
(Continued)

(58) Field of Classification Search
CPC ....... H01L 41/27; H01L 41/45; H01L 41/193; H01L 41/297
See application file for complete search history.

(56) References Cited

U.S. PATENT DOCUMENTS 3,655,971 A * 4/1972 Haas ................. G02F 1/132
250/474.1
6,423,412 B1 7/2002 Zhang et al.
(Continued)

FOREIGN PATENT DOCUMENTS

| KR | 2010-0046641 A | 5/2010 |
| WO | 2012/118916 A2 | 9/2012 |
| WO | 2015/071567 A1 | 5/2015 |

OTHER PUBLICATIONS

V. Tomer, et al., "High field properties and energy storage in nanocomposite dielectrics of poly(vinylidene fluoride-hexafluoropropylene)," Journal of Applied Physics, vol. 110, No. 4, Aug. 2011, (10 pages).
(Continued)

*Primary Examiner* — Paul D Kim
(74) *Attorney, Agent, or Firm* — Oblon, McClelland, Maier & Neustadt, L.L.P.

(57) ABSTRACT

A method for manufacturing an electroactive actuator is provided. The method includes applying a layer of an electroactive polymer to an electrode surface, crystallizing the electroactive polymer by application of U.V. flash and applying a second electrode onto the crystallized electroactive polymer layer. According to the method a stack of multiple superimposed first electrode layers, electroactive polymer layers and second electrode layers may be obtained.

17 Claims, 6 Drawing Sheets

(51) Int. Cl.
    *H01L 41/45*     (2013.01)
    *H01L 41/047*     (2006.01)
    *H01L 41/083*     (2006.01)
    *H01L 41/193*     (2006.01)
    *H01L 41/297*     (2013.01)

(52) U.S. Cl.
    CPC .......... *H01L 41/193* (2013.01); *H01L 41/297* (2013.01); *H01L 41/45* (2013.01); *H01L 41/047* (2013.01)

(56) References Cited

U.S. PATENT DOCUMENTS

| | | |
|---|---|---|
| 2002/0090517 A1 | 7/2002 | Zhang et al. |
| 2007/0170822 A1* | 7/2007 | Pei ..................... H01L 41/0536 |
| | | 310/363 |
| 2010/0007285 A1 | 1/2010 | Schroder et al. |
| 2012/0171442 A1* | 7/2012 | Yamamoto ............. B32B 38/06 |
| | | 428/212 |
| 2012/0200200 A1 | 8/2012 | Jung et al. |
| 2013/0160318 A1 | 6/2013 | Shroder et al. |
| 2014/0145092 A1 | 5/2014 | Schroder et al. |
| 2014/0290834 A1 | 10/2014 | Egron et al. |

OTHER PUBLICATIONS

"Sinteron 2000", Xenon Corporation, 2010, (5 pages).
International Search Report dated Jun. 18, 2015 in PCT/EP2015/057117 filed Mar. 31, 2015.

\* cited by examiner

METHOD FOR MANUFACTURING AN ELECTROACTIVE ACTUATOR

TECHNICAL FIELD OF THE INVENTION

The invention relates to the field of electroactive actuators or haptic devices based on an electroactive polymer. It also relates to microelectronic devices comprising one or several electroactive actuators. The invention has for example for a particularly advantageous application the field of smartphones, switches and devices comprising optics such as cameras or video cameras.

PRIOR ART

The electroactive actuators can for example be used in cameras for the zoom function, in the manufacture of switches, in robotics and in the manufacture of smart muscle tissue based on the haptic effect. Furthermore, this type of actuator can be used in touch tablets. The polymer that is often used in these devices is with a base of P(VDF-TrFe-CFE) (Poly(vinylidenefluoride-Trifluoroethylene-chlorofluoroethylene) or of P(VDF-TrFe-CTFE) (Poly (vinylidenefluoride-Trifluoroethylene-chloro trifluoroethylene)). This type of polymer responds with a displacement if a sufficient electric field is applied thereto. The electric field in order to have a minimum displacement, for example of 100 nm, is very high (about 30 V/µm).

In order to reduce this minimum voltage to be applied, often qualified as wake-up voltage, a solution consists in increasing the total electrical capacitance of the device by stacking several capacitors in parallel. Each capacity is formed of the metal electrode/polymer/metal electrode stack. The major problem with this solution is the current technological limitation with 2 or 3 layers of polymers.

Indeed, the manufacture of these devices requires a standard thermal annealing (typically 115° C. for 30 to 60 minutes) in order to crystallise the polymer. A good crystallisation of the polymer is indeed necessary in order for it to be electro-actuatable. This crystallisation requires an annealing dedicated to each one of the polymer layers deposited. As the capacitors are stacked, successive annealings are therefore carried out for the same electroactive device. These successive annealings create cracking on the underlying layers because of the differences in stresses between the polymer and the metal deposited, with the thermal expansion coefficients being different between the polymer and the metal electrode. In addition, during the annealing of the underlying layers, the layers of electroactive polymer, already crystallised, undergo an additional annealing which degrades their crystalline structure and therefore their electroactive properties.

A solution to the problem of cracking has been described in the document of JUNG published under number US2012/0200200A1. This document describes the manufacturing of a polymer electrode integrated into an actuator device with a base of P(VDF-TrFe-CFE) or of P(VDF-TrFe-CTFE). The conductive electrode is with a base of polymers such as PEDOT: PSS ((poly(3,4-ethylene dioxy thiophene) (PEDOT):poly(styrene sulfonate) (PSS)) or polyaniline with water as solvent. The objective of this document is to form a hydrophilic surface on the substrate in order to be able to receive the conductive polymer electrode with a base of water (therefore hydrophilic). Using polymer electrodes would make it possible to reduce the differences in stresses during the annealing in the multilayer device, with the conductive polymer electrodes having the same mechanical characteristics as the layers of electroactive polymer.

This solution is not without disadvantages. Indeed, it has been observed with this solution a strong degradation over time of the actuators as the PEDOT: PSS deteriorates very strongly with humidity and its electrical resistance then increases. The entire device has to therefore be perfectly encapsulated or its application has to be reserved for fields that suppress all of the presence of humidity which is very constraining.

Finally a second problem linked with this solution is the need to apply electrical voltages over the entire stack in a first step in order to activate the conductive sites of the layers made of PEDOT: PSS.

Another solution has been proposed by CHOI in document US2012/0139393A1, which describes a stack with a base of this same polymer for the manufacture of an electroactive actuator with a low supply voltage. For this, this document provides to use a protective layer for the electroactive polymer during the stacking in parallel. This protective layer prevents the solvent of the layer of electroactive polymer superposed on a lower layer from degrading (by dissolving it) the lower layer of electroactive polymer. The disadvantage with this method is the introduction of parasitic capacities during the operation of the actuator.

An object of this invention is therefore to propose a solution in order to obtain an electroactive actuator of which the actuating voltage is reduced while still limiting the stresses relative to the humidity and to the adding of a parasitic capacity.

The other objects, characteristics and advantages of this invention shall appear when examining the following description and the accompanying drawings. It is understood that other advantages can be incorporated.

SUMMARY OF THE INVENTION

According to an embodiment, the invention relates to a method for manufacturing an electroactive actuator from a stack comprising at least one first electrode and at least one electroactive layer comprising an electroactive polymer superposed on the first electrode, the electroactive layer having the capacity to respond with a displacement and to drive with it at least the first electrode when an electric field is applied thereto, with the method comprising:
- a step of crystallising the electroactive layer superposed on the stack;
- a step of forming a second electrode in such a way that the electroactive layer is disposed between the two electrodes.

The electroactive polymer is formed of a material able to be crystallised at least partially under the effect of an exposure to ultra-violet (UV) radiation. Moreover, the step of crystallisation comprises a step of exposure of the electroactive layer to ultra-violet radiation during which at least a portion and preferably all ultra-violet radiation is delivered in the form of one or several pulses. This step of exposure to UV radiation can be qualified as UV Flash.

In the framework of developing this invention, it was shown that this technique of exposure comprising an exposure via pulses, and therefore discontinuous, to UV radiation, makes it possible to very effectively crystallise the electro-actuatable polymer. Furthermore, it has been observed that this step does not generate in the underlying electroactive layers or in the underlying electrodes, an increase in the temperature or generate an increase in temperature limited in amplitude and contained to shallow depth. As such, the invention prevents all of the electroactive layers from undergoing the rise in temperature imposed, in the existing solutions, by the annealing aiming to crystallise the latest deposited layer.

The risks of the appearance of cracks due to the differences in the temperature coefficient between the metal electrodes and the electroactive layer are therefore avoided.

Moreover, it is possible to stack several electroactive layers separated by electrodes. In this case, as the lower electroactive layers are not subjected to a rise in the temperature during the crystallisation of the upper layer, the crystalline state of these lower electroactive layers is not degraded during the crystallisation of the layers deposited afterwards.

The invention as such makes it possible to significantly increase the number of electroactive layers in a stack and therefore to considerably improve the performance of haptic devices. Although in practice, the existing solutions require being limited to about 2 or 3 electroactive layers, a device carried out by implementing the invention can easily have more than 3, even more than 5 even more than 10 electroactive layers.

Furthermore, this structure does not impose a non-metal polymer material for the electrodes. This structure is therefore significantly less sensitive to humidity than that mentioned in the section relative to prior art and based on non-metal electrodes and formed in a polymer.

Finally, the invention avoids the introduction of parasitic capacities.

It is specified in the framework of this invention that an exposure by pulse of a layer for a duration of very brief exposure to UV radiation can be qualified as UV Flash.

Optionally, the invention can further have at least one of any of the following characteristics taken individually or in combination:

Advantageously, the duration of each pulse is less than 100 milliseconds (ms, $10^{-3}$ seconds). Using pulses of this duration and not of a continuous flow of ultra-violet radiation decreases the dissipation of the heat inside the polymer and as such makes it possible to prevent the deterioration of the polymer. The energy supplied by the pulse provides a heating that is solely local and fast of the polymer.

Advantageously, the duration of each pulse is less than 10 ms and preferably less than 5 ms and preferably less than 3 ms. Advantageously, the duration of each pulse is between 0.025 ms and 2 ms. For example it is between 0.5 ms and 2 ms. These intervals allow for a particularly effective crystallisation of the layer that receives the radiation in the first instance while highly limiting, even completely preventing the propagation of the heat in the underlying layers. These intervals as such make it possible for each one of the layers to perform well without however degrading the performance of the underlying layers. An exposure of this type makes it possible consequently to considerably improve the performance of the electroactuator.

The step of crystallisation comprises a step of exposure of the electroactive layer to ultra-violet radiation only and alternatively to radiation comprising ultra-violet radiation and possibly radiation outside of UV.

The wavelength of the ultra-violet radiation is between 200 nm and 800 nm. (ms, $10^{-3}$ seconds).

Advantageously during the step of exposure the ultra-violet radiation is delivered in the form of a single pulse.

Alternatively during the step of exposure the UV radiation is delivered in the form of a plurality of pulses.

Advantageously the duration of exposure accumulating the duration of each one of the pulses is less than 1 s and preferably less than 500 ms.

Advantageously the ultra-violet radiation is only delivered in the form of said pulse or pulses. In order to allow for a cooling of the polymer between two pulses, said pulses are spaced apart in time.

Advantageously, during a step of exposure the ultra-violet radiation is delivered in the form of one or several pulses, with the fluence of each one of the pulses being less than 50 j/cm$^2$ and preferably being between 2 j/cm$^2$ and 40 j/cm$^2$ and preferably between 5 j/cm$^2$ and 30 j/cm$^2$ and preferably between 15 j/cm$^2$ and 20 j/cm$^2$.

The variation in fluence is necessary when the thickness of the electroactive layer varies. This adaptation of the fluence to the thickness guarantees very good crystallisation of the electroactive layer regardless of its thickness.

Advantageously, the step of crystallisation comprises only said step of exposure.

Advantageously, the electroactive layer is solely constituted of the electroactive polymer.

Advantageously, using the stack comprising at least one layer comprising an electroactive polymer arranged between two electrodes, the following sequences are carried out:

Formation of an additional layer of electroactive polymer superposed on said stack;

Obtaining of an additional electroactive layer via crystallisation of said additional layer of electroactive polymer, with the crystallisation comprising a step of exposure of the additional layer of electroactive polymer to UV radiation, with the step of exposure comprising one or several pulses;

Forming of an electrode superposed on said additional electroactive layer.

A stack of electroactive layers is as such obtained with each one having been subjected to a step of exposure comprising one or several pulses and each one located between two electrodes. The repeating of this sequence and its advantages make it possible to no longer be limited to 2 or 3 electroactive layers, but to stack as many of them as needed.

Advantageously, said sequence is reiterated in such a way as to obtain a stack of a plurality of electroactive layers with each one having been the object of a separate step of UV exposure and each one located between two electrodes.

Advantageously, the plurality of electroactive layers comprises at least three electroactive layers and more preferably five electroactive layers.

More preferably, the stack rests on a substrate that is sufficiently flexible to follow the displacement of the stack.

More preferably, the substrates used are taken for example from the following materials: PEN (polyethylenenaphtalate), PET (polyethylene terephtalate), Kapton (polyimide) or Peek (poly ether ether ketone). These materials are mechanically flexible and chemically inert. They have a low Young's modulus, are flexible, light and conformable.

Advantageously, the thickness of the substrates is between 5 µm and 300 µm, preferably between 5 µm and 200 µm and preferably between 5 µm and 50 µm.

Advantageously, at least some of the electrodes of the actuator are metal electrodes.

Advantageously, the materials used for the metal electrodes include or are formed from a material from: gold, silver, platinum, aluminium, nickel, palladium, copper or indium-tin oxide.

Advantageously, at least some of the electrodes of the actuator are made of graphene or are formed from silver ink in nanowires.

Advantageously, the thickness of the metal layer is between 10 nm and 8 μm and preferably between 10 nm and 1 μm.

More preferably, the methods for the deposition of the metal layers used are for example: physical vapour deposition (PVD), inkjet, screen printing or ultrasonic spraying.

More preferably, the electroactive layers are made of Poly(vinylidenefluoride-Trifluoroethylene-chlorofluoroethylene (P(VDF-TrFe-CFE)) or of Poly (vinylidenefluoride-Trifluoroethylene-chloro trifluoroethylene) (P(VDF-TrFe-CTFE)). These polymers are electroactive. These polymers have a low Young's modulus, a high dielectric constant and a strong deformation when an electric field is applied. The electroactive polymer is not electrically conductive. It can be qualified as a dielectric.

Advantageously, the thickness of the electroactive layer is between 100 nm and 10 μm, and preferably between 100 nm and 4 μm.

More preferably, the methods for the deposition of the electroactive layers used are for example: spin coating, inkjet, screen printing or ultrasonic spraying.

Advantageously, the stack comprises several electroactive layers and after crystallisation of a lower electroactive layer and before the formation of a second upper electroactive layer superposed on the lower electroactive layer, a blocking layer of the UV is carried out arranged between the lower and upper electroactive layers. The blocking layer comprises at least one non-metal compound that absorbs or blocks the UV, in such a way that the blocking layer of the UV blocks at least a portion of the UV passing through the upper electroactive layer and being directed to the lower electroactive layer.

Advantageously, the non-metal absorbing compound forms with the atoms of the electrode, typically atoms of metal, covalent bonds that block or absorb the UV. As such, the UV exposure applied to the recently deposited electroactive layer is not or is very little transmitted to the layer or layers that are underlying thereof. The upper layer can as such be perfectly crystallised without however heating the underlying layers. The latter as such are not subjected to multiple expansions which reduces the appearance of cracks. Furthermore, the crystalline state of all of the underlying layers is not or is very little affected by the UV exposure of the upper layer. The introduction of a layer format a barrier against the UV can as such improve the reliability and the performance of the device. Moreover, this type of compound has for advantage to reinforce the adhesion between the electrode and the electroactive layer at its contact.

Advantageously, the blocking layer of the UV blocks at least 50%, more preferably at least 70% and more preferably at least 90% of the UV passing through the upper electroactive layer and being directed to the lower electroactive layer.

Advantageously, the blocking layer prevents any passage of the UV from the upper electroactive layer to the lower electroactive layer.

Preferentially, the non-metal compound that absorbs or blocks the UV is an organic compound comprising a thiol bond (—SH), also designated as a thiol group (—SH). More preferably, the thiol bonds are taken for example from among the following products: Poly (ethylene glycol) methyl ether thiol, 2,5-dimethylfuran-3-thiol, 2-propene-1-thiol, 5-methoxybenzoxazole-2-thiol, 4-phenylimidazole-2-thiol, 4-phenylthiazole-2-thiol, 5-chloropyrine-2-thiol.

Alternatively, the non-metal compound that absorbs or blocks the UV is an organic compound comprising groups such as amines, silanes and also pyrene molecules.

Advantageously, the blocking layer and the electrode separating the upper electroactive layer from the lower electroactive layer form the same layer, said electrode comprising the non-metal compound that absorbs or blocks the UV.

Advantageously, the blocking layer is formed by the electrode separating the upper electroactive layer from the lower electroactive layer, wherein the non-metal compound that absorbs or blocks the UV forms a thiol bond (—SH) and wherein the concentration in thiol bonds in the electrode is between 0.5% to 10% by weight and preferably between 1% and 5% by weight.

Advantageously, the formation of the electrode comprises a step of deposition of a metal solution by inkjet, screen printing or by ultrasonic spraying, wherein the formation of the blocking layer comprises the incorporation of the thiol bonds to the metal solution, and wherein the incorporation is carried out by mixing the thiol bonds with the metal solution before deposition of the metal solution.

Advantageously, the blocking layer is a separate layer from the electrode separating the upper electroactive layer from the lower electroactive layer, with the blocking layer being located between said electrode and one among the upper electroactive layer and the lower electroactive layer.

Advantageously, the formation of the electrode comprises a step of deposition of a metal via PVD, wherein the formation of the blocking layer comprises the incorporation of the thiol bonds to the metal, and wherein the incorporation is carried out by dipping or evaporation after the deposition of metal.

Advantageously, it is easy to control the bonds formed (R—S) with R: the metal and S: sulphur. This control is carried out for example with an XPS (X-ray Photoelectron Spectrometry) analysis which consists in sending X photons with the same energy that will be used to break these bonds. The final characterisation spectrum has peaks that provide information on the nature of the chemical bonds.

Advantageously, the stack comprises more than two electrodes and only two electrical contacts are formed, either by lithography or by screen printing, and are configured to apply a potential difference over the entire stack.

Advantageously, the electrodes are porous electrodes in order to decrease the effects of Young's modulus and the effects of the difference in the stresses between the electroactive layer and the electrode in order to have the greatest displacement possible of the device.

Advantageously, the technological stack can be constituted of materials that have a Young's modulus at least equal to 200 MPa and preferably between 200 MPa and 5 GPa and preferably between 200 MPA and 2 GPa and, a Poisson's ratio at least equal to 0.30 and preferably between 0.30 and 0.39 preferably between 0.35 and 0.39 and advantageously between 0.38 and 0.39.

More preferably, the electroactive layer is directly in contact with the electrodes that are adjacent to it. According to an embodiment comprising an absorption layer of the UV, the absorption layer of the UV is directly in contact with the electrode that is adjacent to it and is more preferably directly in contact with the electroactive layer that is adjacent to it.

According to another embodiment, the invention related to a method for manufacturing an electroactive actuator from a stack comprising at least one first electrode and at least one electroactive layer comprising an electroactive polymer superposed on the first electrode, the electroactive layer having the capacity to respond with a displacement and to drive with it at least the first electrode when an electric field is applied thereto, with the method comprising:
 a step of crystallising the electroactive layer superposed on the stack;
 a step of forming a second electrode in such a way that the electroactive layer is disposed between the two electrodes.

The electroactive polymer is formed of a material able to crystallise at least partially under the effect of an exposure to ultra-violet (UV) radiation. Moreover, the step of crystallisation comprises a step of exposure of the electroactive layer to ultra-violet radiation. Advantageously, the step of exposure is a step of UV Flash also qualified as UV radiation with ultra brief pulses.

According to an embodiment, the step of UV Flash comprises an exposure of the electroactive layer to ultra-violet radiation during a duration less than or equal to 1 second and preferable less than or equal to 500 milliseconds ($10^{-3}$ s) and preferably less than or equal to 10 milliseconds.

According to an embodiment, the step of exposure consists only in a step of UV Flash.

All of the characteristics mentioned hereinabove in relation with the preceding embodiment can be combined with this other embodiment. In particular, the step of UV Flash can comprise a single or several pulses.

According to yet another embodiment, the invention relates to an electroactive actuator comprising a stack comprising a plurality of superimposed electroactive layers, each one associated with two electrodes. At least some of the electroactive layers comprise an electroactive polymer able to crystallise at least partially under the effect of an exposure to ultra-violet radiation. The electroactive actuator comprises, between two superimposed electroactive layers, at least one layer comprising a non-metal compound that absorbs or blocks the UV.

The use of at least one layer comprising at least one non-metal compound that absorbs or blocks the UV is an embodiment that can be carried out independently of the use of the UV Flash technique described hereinabove.

The use of this type of blocking layer makes it possible to reduce, and even prevent, the propagation of heat into the lower electroactive polymer layers and as such provide a solution to this problem.

Optionally and advantageously, the non-metal compound that absorbs or blocks the UV is an organic compound comprising a thiol bond (—SH).

Optionally and advantageously, the device comprises one or several electroactuators according to the invention.

All of the characteristics described hereinabove, taken individually or separately, can be combined with this embodiment.

Another object of this invention relates to a microelectronic device comprising one or several haptic devices or electroactuators according to the invention. Microelectronic device means any type of device carried out with microelectronic means. These devices encompass in particular in addition to devices with a purely electronic purpose, micromechanical or electromechanical devices (MEMS, NEMS . . . ) as well as optical or optoelectronic devices (MOEMS . . . ).

A microelectronic device can as such for example be a photo camera, a zoom for a camera, a smartphone, a mechanical switch, a touch tablet.

BRIEF DESCRIPTION OF THE FIGURES

The purposes, objects, as well as the characteristics and advantages of the invention shall appear better in the detailed description of an embodiment of the latter which is shown by the following accompanying drawings wherein.

The drawings are given by way of examples and do not limit the invention. They constitute diagrammatical block representations intended to facilitate the understanding of the invention and are not necessarily to the scale of the practical applications. In particular the relative thicknesses of the different layers and films are not representative of reality.

DETAILED DESCRIPTION OF THE INVENTION

It is specified that in the framework of this invention, the term "on", "superposed", "covers" or "underlying" or their equivalents do not mean "in contact with". As such for example, the deposition of a first layer on a second layer, does not necessarily means that the two layers are directly in contact with one another but this means that the first layer at least partially covers the second layer by being either directly in contact with it or by being separated from it by at least one other layer or at least one other element.

In this patent application, the thickness is taken according to a direction perpendicular to the main faces of the substrate whereon rests the various layers. In the figures, the thickness is taken according to the vertical.

In the framework of this invention, electroactive material designates a material that has the capacity to respond by a displacement when an electric field is applied to it.

In the framework of this invention, UV Flash designates an exposure to, among others, ultraviolet radiation (wavelength between 200 nm and 800 nm) comprising one or several pulses. Each pulse being preferably less than 100 ms. In the case of exposure to several pulses, the pulses are spaced in time so as to allow the exposed layer to cool and as such prevent the heat from propagating to the underlying layers.

The invention shown here consists in a method for manufacturing electroactive actuators that can work at low voltage, reducing the risks of cracking, of introducing parasitic capacitance and of degradation over time linked to humidity.

An example of the method according to the invention for the carrying out of an electroactive actuator is described hereinbelow in reference to FIGS. 1 to 5.

Figure 1:
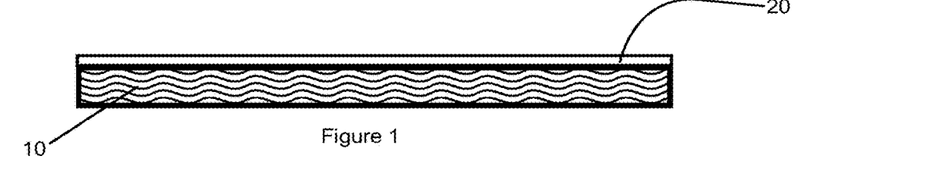
FIGS. 1, 2, 3, 4 and 5 show the different technological steps of an embodiment of electroactive actuators based on this invention.

The first step, shown in FIG. 1, consists in depositing a metal layer 20 on a flexible substrate 10. The latter is for example in PEN, PET, Kapton or Peek. Its thickness can be between 5 µm and 300 µm and preferably between 5 µm and 200 µm and preferably between 5 µm and 50 µm The material used for the electrode 20 is more preferably made of metal. It can for example include or be constituted of gold (Au), of silver (Ag), of platinum (Pt), of aluminium (Al), of nickel (Ni), of palladium (Pd), of copper (Cu) or of indium-tin oxide (ITO). The thickness of this metal layer 20 can be between 10 nm and 8 µm and preferably between 10 nm and 1 µm The deposition of this metal layer 20 can be carried out by various techniques such as for example a physical vapour deposition (PVD), by inkjet, by screen printing or by ultrasonic spraying.

The recourse here to a silver ink in nanowires deposited by screen printing, inkjet or ultrasonic spraying, for example, makes it possible to obtain a transparent layer and a greater mechanical flexibility of the actuators. This property of transparency can be sued for some applications such as in touch tablets, for example in order to generate vibration feedback on tablets.

Alternatively the electrode 20 can be carried out in graphene which can be a deposition in solution, graphene is transparent, conductive and economically advantageous.

Figure 2:
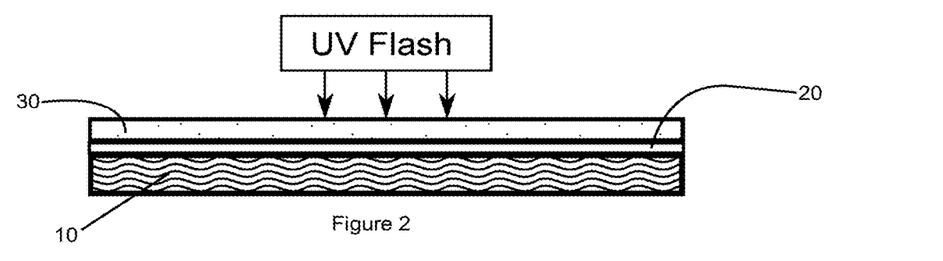

The second step, shown in FIG. 2, comprises the formation of an electroactive layer 30 on the electrode 20 formed in the preceding step, qualified as a lower electrode.

This step comprises the deposition of P(VDF-TrFe-CFE) or of P(VDF-TrFe-CTFE) in a solution in a solvent such as cyclopentanone for example. The deposition on the stack is done for example by spin coating, inkjet, screen printing, or ultrasonic spraying. According to an embodiment, the thickness of the electroactive layer 30 is between 100 nm and 10 µm and preferably between 100 nm and 4 µm. Once deposited, the layer of polymer 30 must be made crystalline, totally or at least partially. For this, the invention provides to carry out a crystallisation via UV Flash, also called UV annealing with pulses, with these pulses being less than 100 milliseconds.

The duration of the UV Flash pulse (ultra-violets (UV)) is advantageously between 0.5 ms and 3 ms and preferably between 1 ms and 2 ms. This crystallisation via UV Flash uses a fluence that varies between 5 j/cm$^2$ and 30 j/cm$^2$ and preferably between 15 j/cm$^2$ and 20 j/cm$^2$. More preferably, for a layer of polymer of 2 µm, a flow of 17 j/cm$^2$ is applied at a distance of 7 cm between the substrate and the UV flash lamp This method of crystallisation via UV Flash is very fast, simple and reliable. This step can then replace the so-called standard thermal annealing which is 115° C. for 30 to 60 minutes. An annealing is necessary for the crystallisation of the electroactive polymer. However successive standard thermal annealings of the same layer deteriorates its crystallinity, decreasing because of this its electroactive properties. This technique makes it possible prevent these disadvantages. Using the technique of crystallisation via UV Flash makes it possible to decrease the effect of degradation and of cracking on the previously annealed layers, with its action being superficial.

Figure 3:
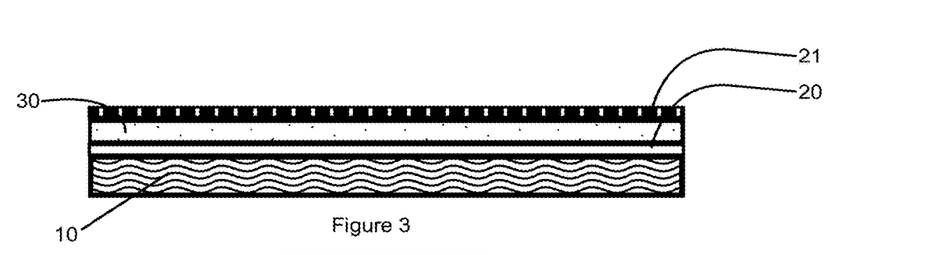

The following step, shown in FIG. 3, comprises the formation of an upper electrode 21 for the electroactive layer 30 formed in the preceding step.

In the case where the electrode 21 is made of metal, this step comprises the deposition of a metal layer of Au, Al, Pt, Ag, Cu, Ni, Pd or ITO for example, by PVD, by impression in a solution, by inkjet, by screen printing or by ultrasonic spraying, for example.

The thickness deposited is between 10 nm and 8 µm and preferably between 10 nm and 1 µm. According to an optional and very advantageous embodiment, a blocking layer of the UV is carried out. This layer has for function to absorb or block a portion at least of the UV reaching a first face of this blocking layer and to as such limit the flow of UV transmitted to a layer in contact with a second face of the blocking layer opposite the first face. This layer forms as such a barrier against UV.

It makes it possible to reduce the possibility that the flow of UV supplied to an upper electroactive layer 31, for example of which one face is arranged in the open air, reaches a lower electroactive layer arranged downstream of the upper electroactive layer in relation to the flow of UV.

As such, the lower electroactive layer 30 is not or is only very little impacted by the flow of UV supplied to the upper electroactive layer 31 in order to crystallise the latter, and this, even if the thicknesses of the various layers are low or the power of the flow of UV is high. Consequently, the lower electroactive layer 30 is not or is only very little degraded.

The risks of the appearance of cracks or of degradation of the crystalline state of the superimposed electroactive layers are therefore reduced, all the more so that the thicknesses of the various layers are low or the power of the flow of UV is high.

This embodiment of the invention as such makes it possible to reinforce the reliability of the method and of the electroactive actuator obtained while retaining a rapid and simple method.

This blocking layer can either be incorporated into the electrode 21 or be located between the electrode 21 and the electroactive layer 31, for example, by being formed on a face of the electrode 21.

More preferably, the blocking layer of the UV comprises at least one non-metal compound that absorbs or blocks the UV.

According to an embodiment, this compound comprises a thiol bond (—SH), also designated as a thiol group (—SH).

—SH bonds (thiol) are incorporated in different ways according to the technique for the deposition of the metal film 21 used. These —SH bonds are contained in products such as for example: Poly(ethylene glycol) methyl ether thiol, 2,5-dimethylfuran-3-thiol, 2-propene-1-thiol, 5-methoxybenzoxazole-2-thiol, 4-phenylimidazole-2-thiol, 4-phenylthiazole-2-thiol, 5-chloropyrine-2-thiol for example.

Advantageously, the thiol bonds make it possible to form covalent bonds with the metal when they absorbent of UV. This makes it possible to reinforce the cohesion of the stack which is advantageous when the thiol bonds are deposited at the electrode/electroactive layer interface. They make it possible to protect the lower layers of polymer from UVs.

The concentration of these thiol bonds in preferably between 0.5% to 10% by weight and preferably between 1% and 5% by weight. This molecule is electrical insulating, all that is not grafted (that does not have the form of a covalent bond) is a source of parasitic capacity, leading to the necessity to adapt the concentration to the metal material present. The objective is to graft all of the molecules without the insulating phase between the metal particles (without an agglomerate of non-grafted molecules)

If the metal is deposited via PVD (physical vapour deposition) or in a solution by inkjet, screen printing, then these thiol bonds are more preferably deposited via dipping or by evaporation for example and this after the deposition of the metal. If the metal is deposited in a solution via screen printing, inkjet or by ultrasonic spraying for example, then these bonds are more preferably added and mixed in the solution of the metal to be deposited.

Figure 4:
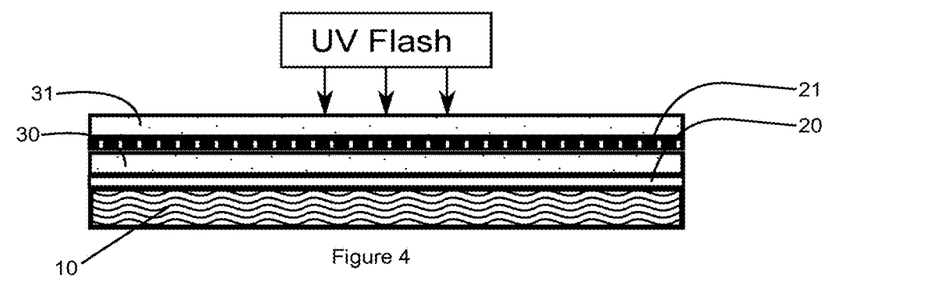

The following step, shown in FIG. 4, comprises the formation of an additional electroactive layer 31. This step comprises for example the deposition of P(VDF-TrFe-CFE) or of P(VDF-TrFe-CTFE) in a solution via spin coating, inkjet, screen printing or by ultrasonic spraying for example. Its thickness is between 100 nm and 10 µm and preferably between 100 nm and 4 µm.

This deposition is then followed by a crystallisation via UV Flash with a pulse of a duration that varies between 0.5 ms and 3 ms and preferably between 1 ms and 2 ms and for a fluence varying between 10 j/cm$^2$ and 30 j/cm$^2$ and preferably between 15 j/cm$^2$ and 20 j/cm$^2$. This step allows for the crystallisation of this recently deposited electroactive layer 31.

This upper electroactive layer 31 is superposed on the absorption layer of the UV, with the latter being arranged on or integrated into the electrode 21 already formed and located under the upper electroactive layer 31. The presence of the highly absorbing compound in the UV spectrum, typically the thiol bonds, allows for a protection of the underlying layers. In the example shown, limited to two layers only, the electroactive layer 30 does not receives or receives only little UV during the exposure serving to crystallise the electroactive layer 31. The cracking of the latter and the degradation of their crystalline structure is as such prevented.

Figure 5:
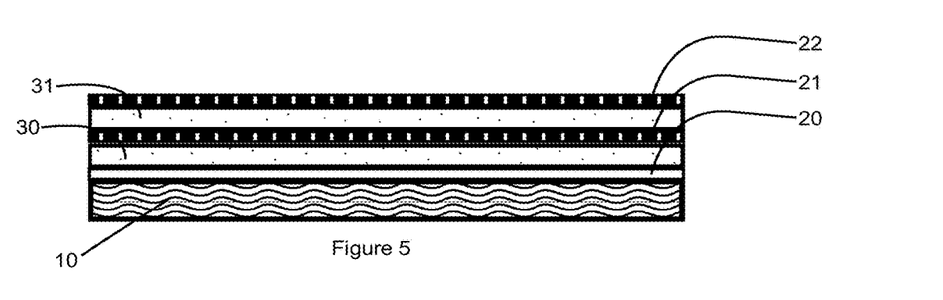

The following step, shown in FIG. 5, shows the carrying out of an additional electrode 22, that makes it possible to form, with the electrode 21 and the electroactive layer 31 a capacitor. This step comprises the deposition of a metal layer 22 of Au, Al, Pt, Ag, Cu, Ni, Pd or ITO for example. As indicated hereinabove, this step can be carried out via PVD, by impression in a solution, by inkjet, by screen printing or by ultrasonic spraying for example.

The thickness deposited is between 10 nm and 8 µm and preferably between 10 nm and 1 µm.

Advantageously to the electrode 22 is associated an additional layer of absorption of UV. This absorption layer is either integrated within the electrode 22 or is affixed to the latter. Typically, in order to form this absorption layer —SH (thiol) bonds will again be used.

Their incorporation can be carried out in different ways according to the technique for the deposition of the metal film used. If the metal is deposited via PVD, then these thiol bonds are more preferably deposited by dipping or by evaporation for example and this after the deposition of the metal. If the metal is deposited in a solution by screen printing, inkjet or by ultrasonic spraying for example, whereas these bonds are more preferably added and mixed into the solution of the metal to be deposited.

In the example shown, the stake shown comprises only two electroactivatable layers and three electrodes. It is easily understood that by reproducing the preceding steps, a stack can be obtained with n electroactivatable layers and n+1 electrodes. The invention makes it possible to obtain without difficulty reliable and high-performance electroactuators that have more than 5 to 10 electroactivatable layers.

Figure 6:
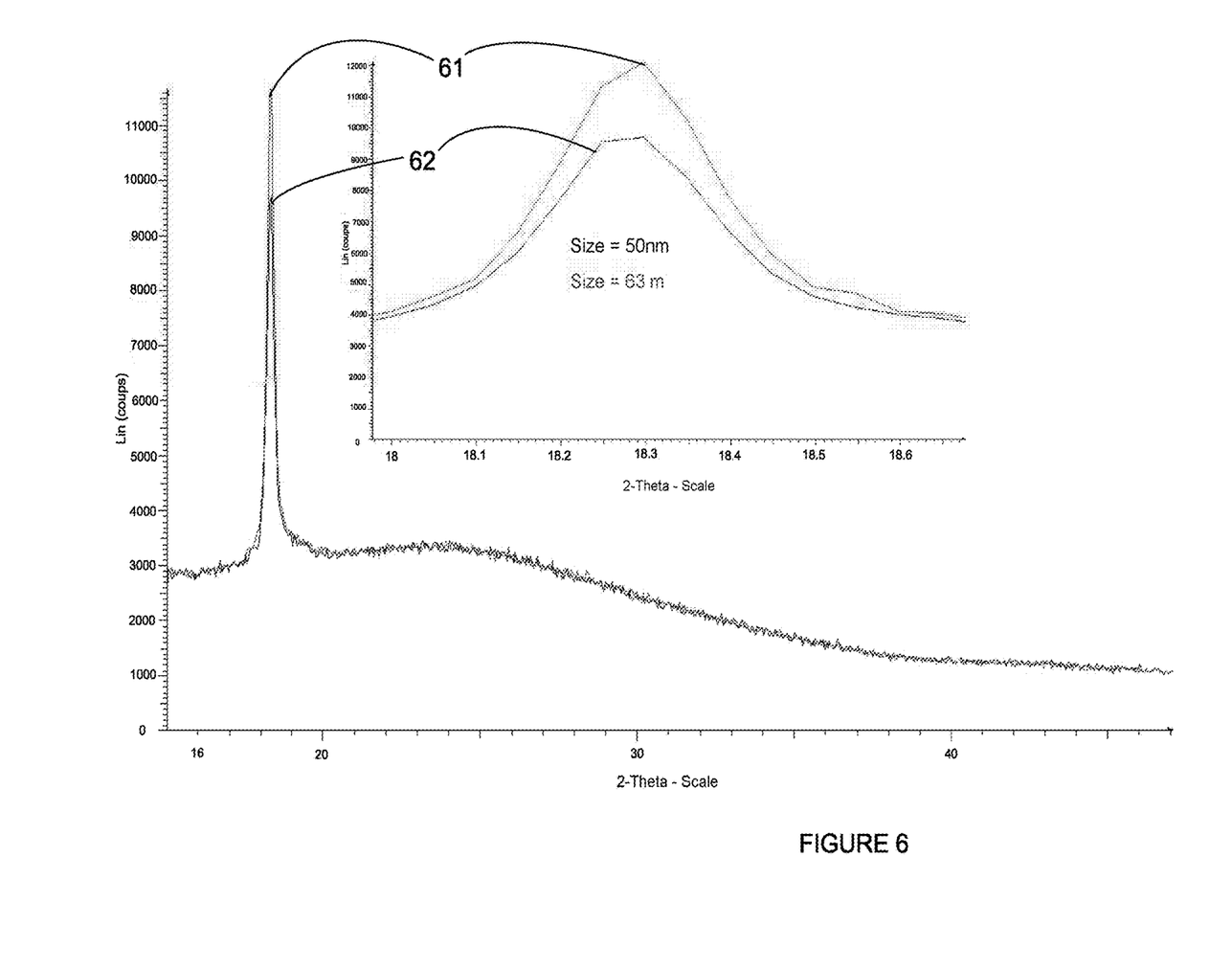
FIGS. 6 and 7a and 7b show comparative studies of the crystallisation of the film of P(VDF-TrFe-CTFE) between a standard annealing and a crystallisation via UV Flash.

Finally, this technique of crystallisation via UV Flash is very fast and very simple. It provides a crystallisation similar to a standard thermal annealing. This is shown in FIG. 6 which compares the diagram 61 of diffraction X of a standard annealing and the diagram 62 of a UV Flash annealing.

The diagram 61 is obtained by analysis of a layer 2 µm thick of P(VDF-TrFe-CTFE) annealed with a conventional annealing at 115° C. for 30 minutes. The diagram 62 is obtained by analysis of a layer 2 µm thick of P(VDF-TrFe-CTFE) annealed via UV flash with a pulse duration of 2 ms with a number of flashes (or pulses) of 5 and a fluence of 17.5 j/cm$^2$.

This experiment clearly shows that the crystallisation is identical between the two techniques with a very reliable variation of the size of the crystallites.

Figure 7A:
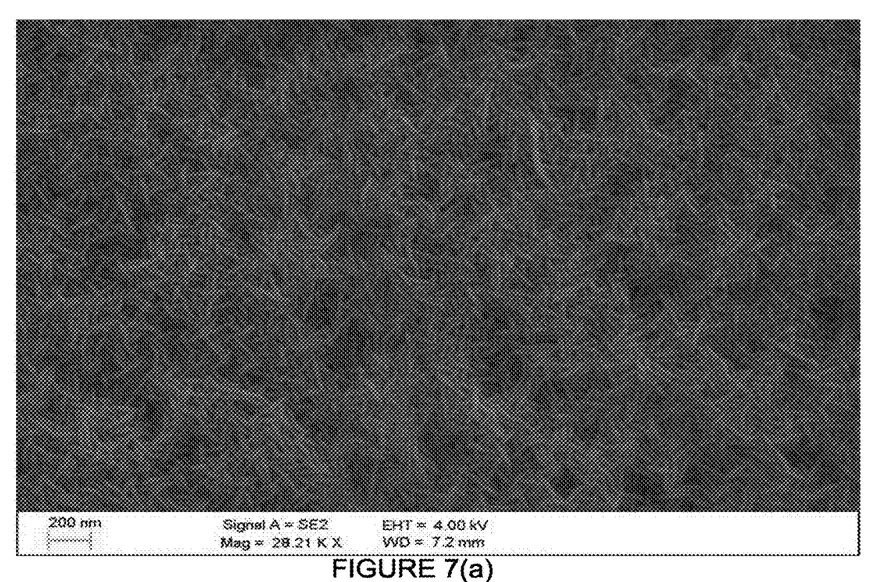
Figure 7B:
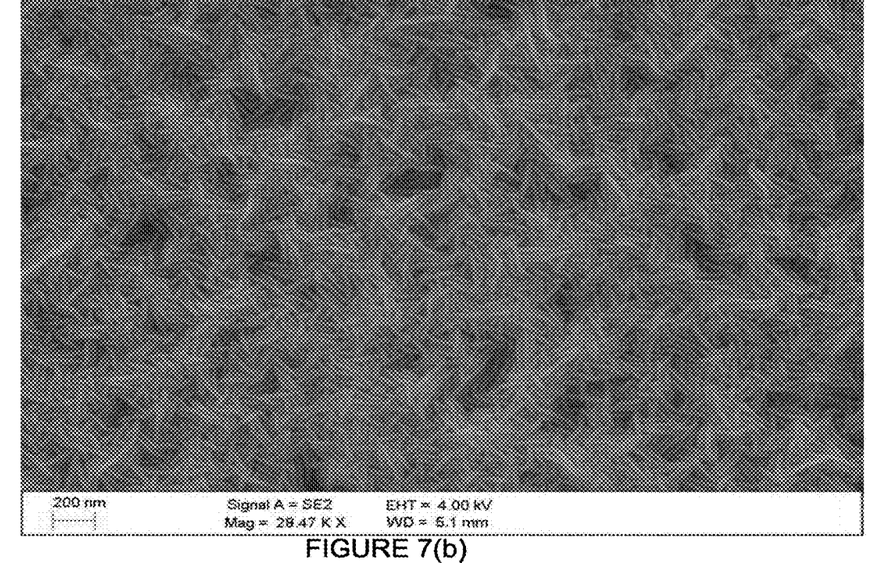

In addition, FIGS. 7a and 7b show under the scanning electron microscope the crystalline structure of a sample annealed via UV Flash for FIG. 7a and by standard thermal annealing for FIG. 7b. The structures observed are substantially identical.

Figure 8A:
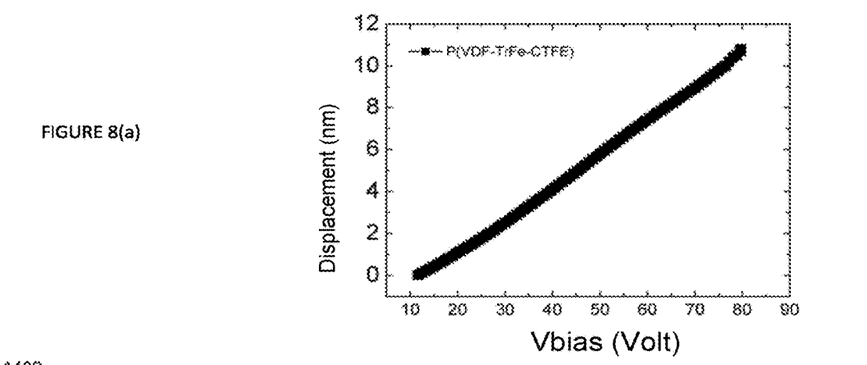
FIG. 8a shows the displacement of an actuator with a base of P(VDF-TrFe-CTFE) carried out by this technique according to the vertical (z) according to the voltage applied on two of its sides, and according to the electric field for FIG. 8b. Finally
Figure 8B:
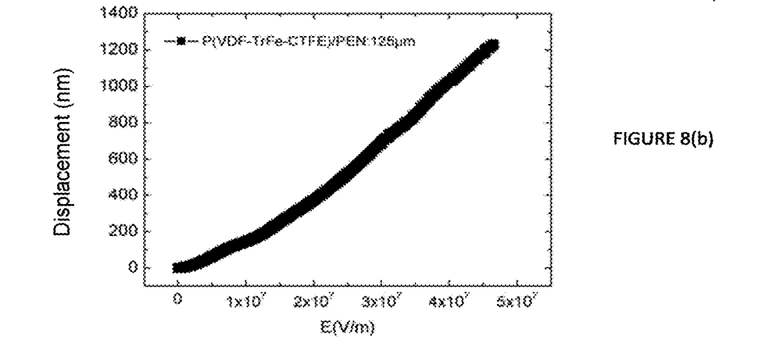
Figure 8C:
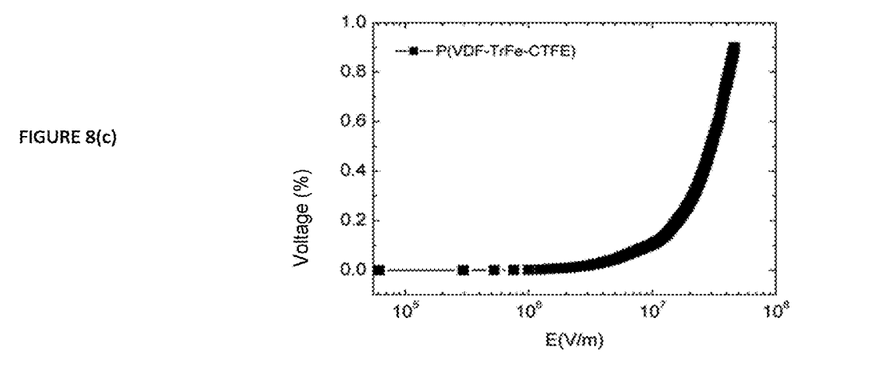
FIG. 8c shows the deformation as a percentage of the device according to the electric field applied according to the vertical z to which corresponds the thickness of the device.

FIGS. 8a and 8b show measurements of displacement along z (vertical direction) to the plan of the actuators according to the voltage and the electric field E thanks to a laser vibrometer, as well as the measurement of the stress applied onto the device according to the electric field (FIG. 8c). A voltage is applied on the sides of a free actuator. This voltage provokes a stress on the electroactive material. A measurement of the displacement of the actuator according to the direction z, for example, is then carried out. FIG. 8a shows these measurements. Then FIG. 8b shows this same displacement but according to the electric field. In this embodiment and for this experiment, the substrate is a substrate made of PEN of a thickness of 125 µm.

Figure 10A:
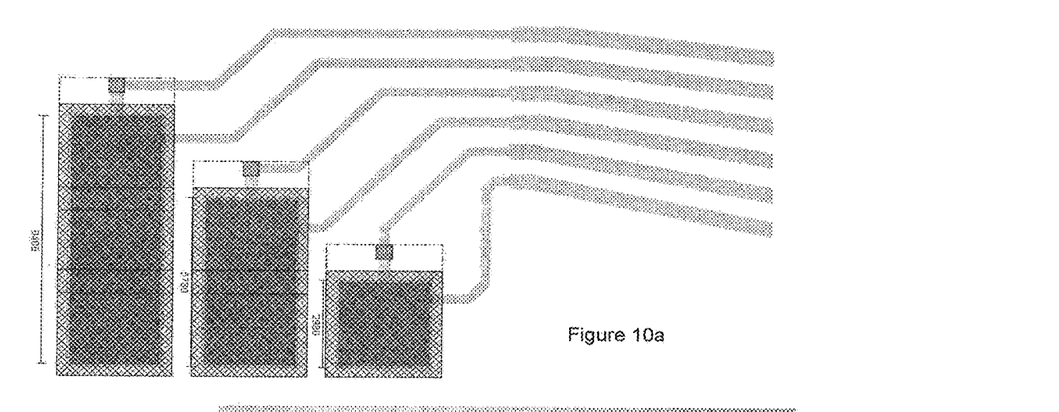
FIGS. 10a and 10b show a diagram for the design of three electroactive actuators 10a and an optical photograph 10b of these three actuators once carried out.
Figure 10B:
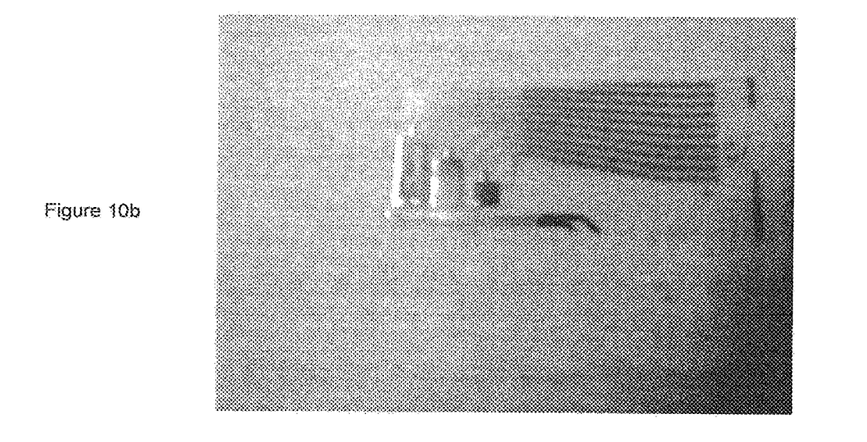
Figure 11:
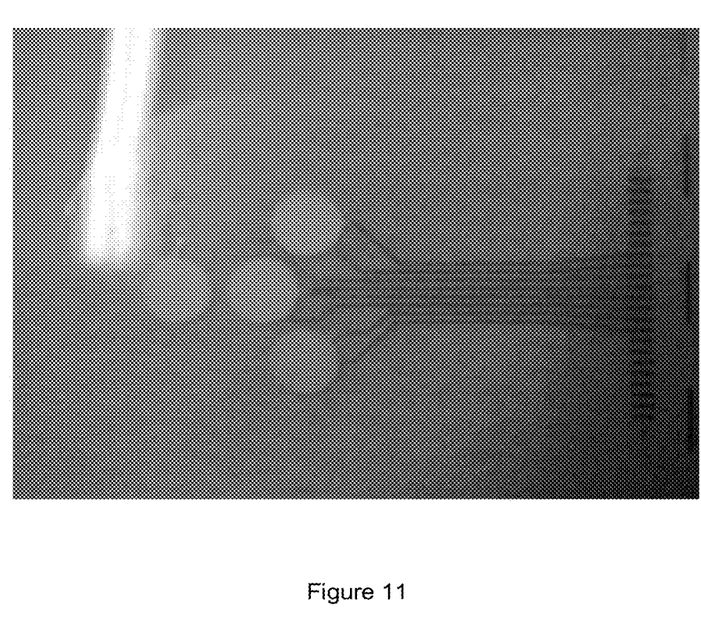
FIG. 11 shows an optical image of a cylindrical actuator pattern. This is an electroactive device (Metal/polymer/metal) of cylindrical shape with a diameter of 7 mm deposited on 125 μm of PEN.

An embodiment of this actuator is shown in FIGS. 10a and 10b: with FIG. 10a being a diagram of three actuators and FIG. 10b being a photograph of the device carried out as such. Starting from the curves mentioned in FIGS. 8a, 8b and 8c, it is possible to extract the value of the electric field required for a deformation of 1% and which is of 50 MV/m. It results from these studies that in order to have a greater displacement, the thickness of the substrate has to be decreased to 8 µm for example in a non-limiting manner. Using materials in the technological stack with a Young's modules preferably between 200 MPa and 5 GPa and preferably between 200 MPA and 2 GPa, and a Poisson's ratio preferably between 0.30 and 0.39 preferably between 0.35 and 0.39 and advantageously between 0.38 and 0.39, can also makes it possible to reach a more substantial displacement for an equivalent electric field.

Finally, the modification of the nature of the electrodes can allow for a decrease in the value of the electric field required to reach 3% deformation.

According to an advantageous embodiment, porous electrodes are used. This makes it possible to decrease the effects of Young's modulus in order to have strong displacements and in order to decrease the differences in stress between the layers of the stack.

Figure 9:
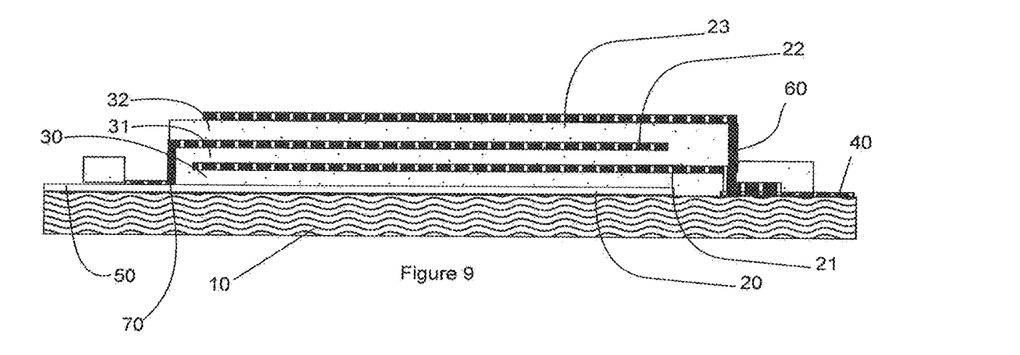
FIG. 9 shows an example of a diagram of the connections of the electrodes for the formation of capacitors by minimising the number of connections.

FIG. 9 shows an embodiment wherein advantageously the number of electrical connections required for the operation of the device is reduced. According to this embodiment, an electroactive actuator is comprised of a stack of n electroactive layers and of (n+1) layers of electrodes. The manufacturing of this device is carried out by superimposing a metal layer and a layer of electroactive polymer by opening a hole each time, also called a via, in this layer of polymer, this hole opens each time by alternating on the metal.

A first electrode 20 is deposited on a fraction of the surface of a substrate 10. Then an electroactive layer 30 is deposited on a fraction of the surface of the electrode 20. A crystallisation of the electroactive layer 30 via UV Flash is then carried out. Then a second electrode 21 is deposited on the electroactive layer in such a way as to not come into electrical contact with the preceding electrode 20. Then, again, an electroactive layer 31 is deposited on the surface of the electrode 21. This electroactive layer 31 is in contact with the electroactive layer 30. A step of crystallisation of the electroactive layer 31 is then carried out via UV Flash. Again an electrode 22 is deposited on a fraction of the surface of the electroactive layer 31 in such a way that the electrode 22 is in electrical contact with the electrode 20 and that it is not in electrical contact with the electrode 21. Then a third electroactive layer 32 is deposited on the surface of the electrode 22. The electroactive layer 32 is in contact with the electroactive layer 31. The electroactive layer 32 then undergoes a crystallisation via UV Flash. A last electrode 23 is then deposited on a fraction of the surface of the electroactive layer 32 in such a way that the electrode 23 is in electrical contact with the electrode 21 and that it is not in electrical contact with the electrodes 20 and 22. In the end, the electrodes 20 and 22 are in electrical contact by the conductive part 70, and the electrodes 21 and 23 are in electrical contact by the conductive part 60. Finally, the connection 50 is electrically in contact with the part 70 and the connexion 40 is electrically in contact with the part 60, in such a way that the application of a potential difference between the connections 50 and 40 is sufficient to simultaneously activate the electroactive layers 30, 31 and 32.

According to this embodiment, all of the odd electrodes have a common electrical connection with the first electrode deposited and all of the even electrodes have a common electrical connection with the second electrode deposited. The terms "even" and "odd" refer to the order of deposition of the electrodes between them, with the first electrode having a number "one" attributed, therefore odd, and with the second electrode having the number "two" attributed, therefore even.

It is possible to continue this embodiment in order to obtain a device that is thicker, however the main characteristic of this embodiment is based on the use of only two electrical contacts in order to apply a potential difference on all of the electroactive layers. This embodiment allows for a decrease in the electrical voltage applied to the total device, it also makes it possible to have a substantial displacement of the device.

The preceding description clearly shows that the invention makes it possible to obtain a stack of n layers of crystallised electroactive polymers (as shown in FIG. 5) and of n+1 electrodes without cracking, thanks to the superficial action of the UV Flash annealing and optionally thanks to the protection of the lower layers carried out by the thiol bonds.

The invention is not limited to the embodiments described hereinabove and extends to all of the embodiments covered by the claims.

| FIG. 1 | |
| --- | --- |
| Flash UV | UV Flash |
| FIG. 3 | |
| Flash UV | UV Flash |
| FIG. 6 | |
| Taille = 50 nm | Size = 50 nm |
| Taille = 63 m | Size = 63 m |
| 2-Theta-Echelle | 2-Theta-Scale |
| Lin (coups) | Lin (coups) |
| FIG. 8a | |
| Déplacement (nm) | Displacement (nm) |
| V$_{bias}$ (Volt) | V$_{bias}$ (Volt) |
| FIG. 8b | |
| Déplacement (nm) | Displacement (nm) |
| FIG. 8c | |
| Tension (%) | Voltage (%) |

The invention claimed is:

1. A method for manufacturing an electroactive actuator from a stack comprising at least one first electrode and at least one layer comprising an electroactive polymer superposed on the at least one first electrode, with the at least one electroactive polymer having the capacity to respond by a displacement when the electroactive polymer is in a crystalline state and when an electric field is applied thereto, the method comprising:
    obtaining an electroactive layer by crystallizing the at least one electroactive polymer of a layer of the at least one electroactive polymer superposed on the stack; and
    forming at least one second electrode such that the electroactive layer is disposed between the at least one first electrode and the at least one second electrodes;
    wherein:
    the electroactive polymer is formed of a material able to crystallise at least partially under the effect of an exposure to the ultra-violet (UV) radiation; and
    the crystallizing comprises exposing the electroactive layer to ultra-violet radiation during which a portion at least of the ultra-violet radiation is delivered in the form of one or several pulses, with the duration of each pulse being less than 100 milliseconds (ms) ($10^{-3}$ seconds).

2. The method according to claim 1, wherein using the stack comprising the at least one layer comprising the electroactive polymer arranged between two electrodes, the following sequence of steps is carried out:
    formation of an additional layer of electroactive polymer superposed on said stack;
    obtaining of an additional electroactive layer by crystallisation of said additional layer of electroactive polymer, with the crystallisation comprising a step of exposure of the additional layer of electroactive polymer to UV radiation, with the step of exposure comprising the pulse or pulses;

formation of an electrode superposed on said additional electroactive layer.

3. The method according to claim 2, wherein said sequence of steps is reiterated to obtain a stack of a plurality of electroactive layers with each one having been subjected to an independent step of exposure of the electroactive layer to ultra-violet radiation and each one located between two electrodes.

4. The method according to claim 3, wherein the plurality of electroactive layers comprises at least three electroactive layers.

5. The method according to claim 1, wherein the duration of each pulse is less than 10 ms, and wherein the duration of exposure is between 0.5 ms and 3 ms, and wherein during the step of exposure the ultra-violet radiation is delivered in the form of one or several pulses, with the fluence of each one of the pulses being less than 50 j/cm$^2$.

6. The method according to claim 1, wherein the step of crystallisation comprises only said step of exposure, and wherein the electroactive layer is constituted solely of the electroactive polymer.

7. The method according to claim 1, wherein the stack rests on a substrate that is sufficiently flexible to follow the displacement of the stack.

8. The method according to claim 3, wherein at least some of the electrodes of the plurality of electroactive layers of the actuator are metal electrodes.

9. The method according to claim 3, wherein at least some of the electrodes of the plurality of electroactive layers of the actuator are made of graphene or are formed from a silver ink on nanowires.

10. The method according to claim 3, wherein the stack comprises several electroactive layers and wherein after crystallisation of a lower electroactive layer and before the formation of a second upper electroactive layer superposed on the lower electroactive layer, a UV blocking layer is formed between the lower and upper electroactive layers, said blocking layer comprising at least one non-metal compound that absorbs or blocks the UV, such that the UV blocking layer blocks at least a portion of the UV passing through the upper electroactive layer from the lower electroactive layer.

11. The method according to claim 10, wherein the non-metal compound that absorbs or blocks the UV comprises a thiol bond (—SH).

12. The method according to claim 10, wherein the UV blocking layer is formed by the second electrode of the lower electroactive layer, wherein the non-metal compound that absorbs or blocks the UV forms a thiol bond (—SH) and wherein the concentration in thiol bonds in the second electrode is between 0.5% to 10% by weight.

13. The method according to claim 10, wherein the blocking layer and the second electrode separating the upper electroactive layer from the lower electroactive layer are combined as one layer, said electrode comprising the non-metal compound that absorbs or blocks the UV.

14. The method according to claim 1, wherein the formation of the at least one second electrode comprises deposition of a metal solution by inkjet, screen printing or by ultrasonic spraying.

15. The method according to claim 10, wherein the blocking layer is a separate layer from the second electrode of the lower electroactive layer separating the upper electroactive layer from the lower electroactive layer, with the blocking layer being located between said second electrode and the upper electroactive layer or between the lower electroactive layer and the second electrode.

16. The method according to claim 1, wherein the electroactive polymer comprises a Poly vinylidenefluoride-Trifluoroethylene-chloro-fluoroethylene) (P(VDF-TrFe-CFE)) or a Poly(vinylidenefluoride-Trifluoroethylene-chloro trifluoroethylene) (P(VDF-TrFe-CTFE)).

17. The method according to claim 1, wherein the stack comprises more than two electrodes and wherein only two electrical contacts are formed, configured to apply a potential difference over the entire stack.

* * * * *